United States Patent
Okubo

(10) Patent No.: US 6,487,225 B2
(45) Date of Patent: *Nov. 26, 2002

(54) SURFACE-EMITTING LASER DEVICE

(75) Inventor: Atsushi Okubo, Sodegaura (JP)

(73) Assignee: Mitsui Chemicals Inc., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/244,094

(22) Filed: Feb. 4, 1999

(65) Prior Publication Data

US 2002/0154664 A1 Oct. 24, 2002

(30) Foreign Application Priority Data

Feb. 4, 1998 (JP) .......................... 10-023530

(51) Int. Cl.$^7$ ............................... H01S 5/00
(52) U.S. Cl. .......................... 372/45; 372/46
(58) Field of Search ............... 372/45, 44, 46

(56) References Cited

U.S. PATENT DOCUMENTS

| 5,467,364 A | 11/1995 | Muro et al. | |
| 6,118,799 A | * 9/2000 | Okubo et al. | ............. 372/46 |

FOREIGN PATENT DOCUMENTS

| EP | 0660472 A2 | 6/1995 | |
| JP | 62136089 A | 6/1987 | |
| WO | WO 96/12328 | * 4/1996 | ............. 372/46 |

OTHER PUBLICATIONS

P.D. Floyd, "Low–Threshold Lasers Fabricated by Alignment–Free Impurity Induced Disordering," IEEE Photonics Technology Letters, 5 (1993) Nov., No. 11, pp. 1261–1263.

Toyoharu Ohata et al., "Surface–emitting laser diodes employing grown–in 45° mirrors," Gallium Arsenide and Related Compounds 1992, Sep. 28, 1992, pp. 797–802, Inst. Phys. Conf. Ser No. 129, Chapter 10.

Yong Cheng et al., "Folded–Cavity Surface–Emitting InGaAs–GaAs Lasers with Low–Threshold Current Density and High Efficiency," IEEE Photonics Technology Letters, 7 (1995) Oct., No. 10, pp. 1104–1106.

"Vertically Emitting Laser with Integrated Non–Absorbing Mirror Deflector," IBM Technical Disclosure Bulletin, vol. 32, No. 3B, Aug. 1989, pp. 498–499.

Y.Cheng et al., "Low–Threshold Native–Oxide Confined Narrow–Stripe Folded–Cavity Surface–Emitting InGaAs–GaAs Lasers," IEEE Photonics Technology Letters, vol. 7, No. 12, pp. 1391–1393, Dec. 1995.

* cited by examiner

Primary Examiner—Paul Ip
Assistant Examiner—Jeffrey N Zahn
(74) Attorney, Agent, or Firm—Birch, Stewart, Kolasch & Birch, LLP

(57) ABSTRACT

In a surface-emitting laser device, an $Al_{0.16}Ga_{0.84}As$ cladding layer, a GaAs optical waveguide layer, an $Al_{0.30}Ga_{0.70}As$ carrier block layer, a GaAs side barrier layer, an InGaAs active layer, a GaAs side barrier layer, an $Al_{0.30}Ga_{0.70}As$ carrier block layer, a GaAs optical waveguide layer, an $Al_{0.16}Ga_{0.84}As$ cladding layer, an etching stop layer, and a contact layer are formed on a GaAs substrate in this sequence. A inclined facet which functions as a reflecting mirror is formed on a resonator optical axis between a horizontal resonator facet and a vertical resonator facet. With the constitution, thermal saturation and facet degradation can be suppressed as much as possible and high optical output power can be obtained.

12 Claims, 3 Drawing Sheets

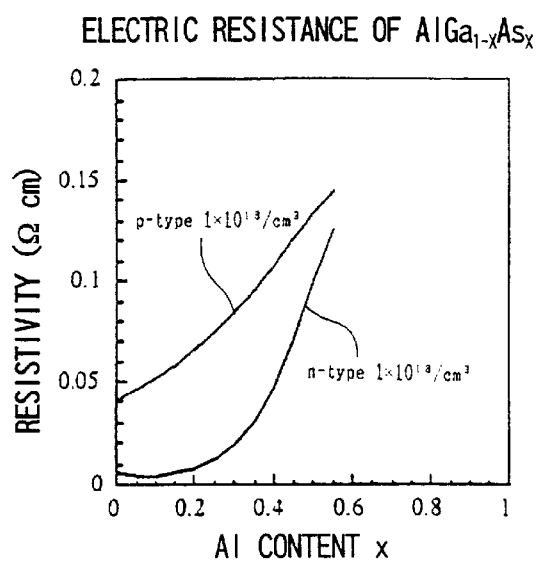 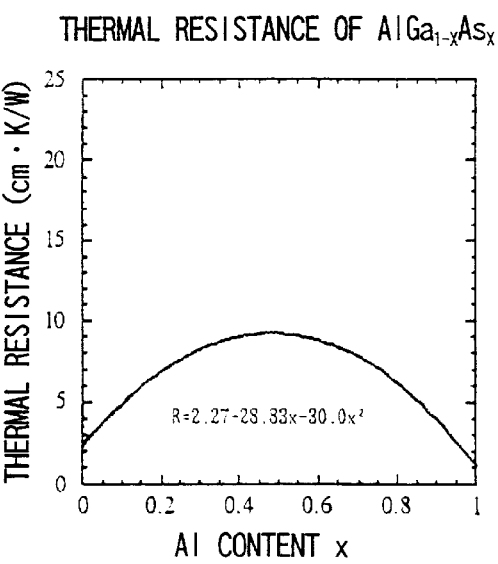
FIG. 5A
ELECTRIC RESISTANCE OF $AlGa_{1-x}As_x$
FIG. 5B
THERMAL RESISTANCE OF $AlGa_{1-x}As_x$
$R = 2.27 - 28.33x - 30.0x^2$

SURFACE-EMITTING LASER DEVICE

BACKGROUND OF THE INVENTION

1. Field of the Invention

The present invention relates to a surface-emitting laser device suitable for communications and measurements, and in particular suitable for multi-channel optical communication systems.

2. Description of the Related Art

As a technology to transmit and process quickly huge information like image information, parallel information processing systems using two dimensional integrated optical devices have been widely studied. For these systems, a surface-emitting laser device which can be arranged in two dimensional arrays is particularly important.

FIG. 3 is a cross-sectional view showing an example of a conventional surface-emitting laser device. This surface-emitting laser device is described in a paper, IEEE PHOTONICS TECHNOLOGY LETTERS, vol. 7 No. 12, DECEMBER 1995 p1391, and on a GaAs substrate 11, a cladding layer 10, an optical waveguide layer 9, an active layer 8 formed of an InGaAs quantum well layer, an optical waveguide layer 7, a cladding layer 6, an etching stop layer 5 and a contact layer 13 are formed in sequence. The active layer 8, the optical waveguide layers 7,9 and the cladding layers 6, 10 constitute a separate confinement heterostructure of a graded index type, dubbed SCH structure. On the top of the contact layer 13 and on the bottom of the substrate 11 are formed electrodes 4,12 for carrier injection, respectively.

The etching stop layer 5 formed between the cladding layer 6 and the contact layer 13 has the function of preventing the cladding layer 6 and layers below the cladding layer 6 from being etched in the process of etching the contact layer 13 to form a horizontal resonator facet 2a. Another resonator facet 2b is formed by cleavage or the like so as to be perpendicular to each layer.

Furthermore, an inclined facet 3 is formed on a resonator optical axis between the horizontal resonator facet 2a and the vertical resonator facet 2b. The inclined facet 3 is inclined from the horizontal optical axis by a certain angle, e.g. 45 degrees, and functions as a reflective mirror for bending the optical axis.

With the above constitution, a laser device in which a laser beam having resonated between the resonator facets 2a and 2b is emitted to the external from the resonator facet 2a, functions as a surface-emitting laser device which can output an emitting beam 1 to the external in the normal direction of the substrate 11. In regard to laser characteristics, in the case of an operation at an operation current of 20 mA, an edge output power of 8 mW and a surface output power of 5 mW are obtained at the facets 2b and 2a, respectively, wherein a threshold current is 6 mA.

In light sources for communication, not only high speed operation but also high power operation is of great importance. Thermal saturation and facet degradation problems are considered as factors that limit the laser output power. The thermal saturation is such a phenomenon that an elevated device temperature due to loss of Joule heat generated by laser oscillation and other losses leads to reduction of the active layer gain and disturbs continuation of oscillation. On the other hand, the facet degradation is an irreversible phenomenon that generation of surface level on the laser emitting facet, caused by impurities and crystal defects, induces light absorption with the result that facet destruction is generated due to local heating.

As shown in FIG. 3, in the surface-emitting laser device with an inclined facet 3 of triangle cross section, heat conduction from the inclined facet 3 to the substrate 11 having large heat capacity is more difficult than that from other facets 2b, and hence the thermal saturation and facet degradation are likely to occur around the inclined facet 3. Furthermore, the inclined facet 3 is likely to be degraded because it is damaged more easily in processing as compared with the other facets 2a and 2b.

The damages in processing will be described in detail in the following. In the case of the surface-emitting laser using an inclined facet, the inclined facet has to be mirror-finished in a flatness of micron order. The practical inclined facet is composed of several laser-constituting layers such as an active layer, waveguide layer and cladding layer exist, and it is necessary to process these layers uniformly to form a mirror surface. As a method of processing the inclined facet is generally employed a dry etching method such as ion beam etching. When the inclined facet is damaged in processing, reabsorption of the laser beam occurs on the inclined facet during laser oscillation, which causes a facet degradation such as so-called catastrophic optical damage.

It is possible to employ a wet etching process as a countermeasure against such problem, in consideration of mirror-finishing while preventing the damage in processing. However, etching characteristics of layers constituting the inclined facet are generally different, and accordingly a step is formed between layers of high etching rate and layers of low etching rate, making it difficult to form a high quality mirror surface. Particularly in the conventional surface-emitting laser device, the Al content of the cladding layer cannot be set much lower so as to keep carrier confinement. In the wet etching process a high-Al-content layer is likely to be oxidized and degraded, causing big barriers to high power laser operation. Furthermore, in the wet etching process a high quality mirror surface has been difficult to form, because differences in etching characteristics between the high-Al-content layers and the low-Al-content layers are likely to cause irregularities on the surface and nonuniformity in orientation of the mirror surface.

Additionally, in order to avoid the thermal saturation and facet degradation in the inclined facet during the laser operation, it is important to reduce the electric resistance and thermal resistance of the device and the optical density thereon.

FIG. 4A is a cross-sectional view showing a typical example of SCH structure type device, and FIG. 4B is a graph showing light intensity distribution thereof. The axis of abscissas indicates positions of the laser device in a layer thickness direction thereof. The axes of ordinates of FIG. 4A and FIG. 4B indicate Al and In contents, and light intensities, respectively. The SCH laser has a layer constitution in which a waveguide layer G is sandwiched between a pair of cladding layers C. The waveguide layer G corresponds to the active layer 8 and optical waveguide layers 7, 9 in FIG. 3, and the cladding layer C corresponds to the cladding layers 6, 10 in FIG. 3.

As shown in FIG. 4A, for example, the composition of the cladding layer C is $Al_{0.60}Ga_{0.40}As$, and Al content of the waveguide layer G decreases continuously toward the center of the active layer in which a quantum well layer formed of InGaAs exists. Regarding AlGaAs type materials, since a band gap tends to increase with increases in Al content thereof, the band gap distribution almost coincides with the graph of FIG. 4A.

The cladding layer C is mainly involved in the light confinement, but practically has also the function of confining carriers which overflow from the quantum well layer depending on the height of the band gap. Accordingly, to maintain satisfactory temperature characteristics, it is necessary for carriers existing in the active layer to sense that the potential barrier of the cladding layer C is high enough.

FIGS. 5A and 5B are graphs showing electric resistance and thermal resistance of AlGaAs type materials, respectively. The axis of abscissas indicates Al contents. As seen from FIG. 5A, although the electric resistance increases with increase in Al content and particularly the p-type material has higher resistance than the n-type material as a whole, the electric resistance of the n-type material abruptly increases when the Al content thereof is higher than about 0.3. The calorific volume increases with increase in electric resistance. As seen from FIG. 5B, the thermal resistance can be expressed as a quadratic function of Al content, which function is figured as a convex parabolic form having a maximum value at an Al content of around 0.5.

Consequently, in order to reinforce the carrier confinement function in the laser device of SCH structure, the employment of the cladding layer C having high Al content is often considered. Such increased Al content, however, causes increases in electric resistance and thermal resistance of the device, and as a consequence it can not be avoided to make sacrifices in thermal characteristics of the device.

Furthermore, in regard to the light intensity, as shown in FIG. 4B, the refractive index difference between the cladding layer C and the waveguide layer G increases with increase in Al content of the cladding layer C, and therefore light distribution is concentrated in the narrow waveguide layer G. As a consequence, the light intensity distribution becomes an exponential type with high peak intensity, and facet degradation is likely to occur around the peak.

SUMMARY OF THE INVENTION

An object of the invention is to provide a surface-emitting laser device capable of suppressing thermal saturation and facet degradation as much as possible and outputting high optical output power.

The present invention provides a surface-emitting laser device comprising:

an active layer;

a pair of optical waveguide layers, disposed on both sides of the active layer, having a band gap wider than or equal to that of the active layer;

a pair of cladding layers disposed so as to sandwich the active layer and the optical waveguide layers, having a band gap wider than or equal to that of the optical waveguide layers;

a carrier block layer disposed between the active layer and at least one of the optical waveguide layers, having a band gap wider than or equal to those of the active layer and the optical waveguide layer; and an inclined facet, formed so as to diagonally cross with an optical axis along the active layer, for reflecting light generated in the active layer, to a layer thickness direction.

According to the invention, the carrier block layer interposed between the active layer and the optical waveguide layer functions to confine carriers into the active layer. For this reason, the composition and dimension of the cladding layer can be designed without considering carefully carrier confinement function of the cladding layer. Consequently, the cladding layer can be employed giving high priority for electric resistance and thermal resistance of the device, and a surface-emitting laser of good thermal characteristics and high output power with suppressed optical peak intensity and high reliability can be realized.

Furthermore, by reducing the thermal resistance of the cladding layer on the substrate side, heat generated around the inclined facet is transferred smoothly to the substrate, resulting in that thermal saturation and facet degradation at the inclined facet is suppressed.

Furthermore, by providing the carrier block layer, it is possible to enhance the freedom of design and to lower the difference in composition ratio between the cladding layer and the optical waveguide layer in comparison with a laser device without carrier block layer. Accordingly, the inclinations of the inclined facet made by etching, which facet is largely occupied by the cladding layers and optical waveguide layers become uniform owing to the small difference in composition ratio between the cladding layer and the optical guide layer. Accordingly preferable reflection characteristics can be obtained along with increased output power and oscillation efficiency. In particular, when the cladding layers and the optical waveguide layers are formed of AlGaAs materials, Al contents of these layers can be reduced and the above mentioned effects are further enhanced.

In the invention, it is preferable that the carrier block layer is disposed between the active layer and each of the optical waveguide layers.

According to the invention, by disposing the carrier block layer between the active layer and each of the optical waveguide layers, the function of confining carriers in the active layer can be fulfilled efficiently.

In the invention, it is preferable that the optical waveguide layers are formed of GaAs.

According to the invention, in regard to AlGaAs type materials, electric resistance and thermal resistance increase with increase in Al content. Accordingly the optical waveguide layer has preferably as low an Al content as possible, and more preferably it is formed of GaAs.

In the invention, it is preferable that the active layer is formed of InGaAs.

According to the invention, as the band gap of the active layer can be small, the potential barrier against carriers in the active layer can be set high enough, and then the effect of carrier confinement into the active layer can be enhanced.

In the invention, it is preferable that a thickness of the carrier block layers is within a range of 5 nm to 50 nm.

According to the invention, to prevent carriers in the active layer from leaking out by tunnel effect, the carrier block layer is needed to have some value of thickness, but when the carrier block layer is too thick, carrier injection efficiency and light exudation efficiency are decreased. Accordingly the carrier block layer preferably has a layer thickness of 50 nm or less. To the contrary, when the carrier block layer is too thin, a band bending phenomena due to the band peak relaxation and tunnel effect cause carrier leakage and depression of the carrier block function. Accordingly, the layer thickness of the carrier block layer is preferably 5 nm or more.

In the invention, it is preferable that the cladding layer is formed of $Al_xGa_{1-x}As$ in which $x \leq 0.3$.

According to the invention, since electric resistance and thermal resistance of AlGaAs type materials increase with increase in Al content, the cladding layer preferably has as low an Al content as possible. More preferably, the cladding layer is formed of AlGaAs in which an Al content is equal to or less than 0.3.

The principle of the invention will be explained in the following. FIG. 1A is a cross-sectional view showing a typical example of a laser device according to the invention, and FIG. 1B is a graph showing the light intensity distribution of the example of FIG. 1A. The axis of abscissas indicates positions of the laser device in a layer thickness direction thereof. The axes of ordinates of FIG. 1A and FIG. 1B indicate Al and In contents, and light intensities, respectively. This laser device has a layer constitution where a waveguide layer G is sandwiched between a pair of cladding layers C, and the waveguide layer G comprises the a central active layer Q, carrier block layers B adjacent to both sides of the active layer Q, and optical waveguide layers adjacent to outsides of the carrier block layers.

Carriers composed of electrons and holes are injected from outsides of the cladding layers C, and emit light after recombination in the active layer Q, whereby laser oscillation occurs by means of the optical resonator. Once the carriers are put into the active layer Q, they are confined thereinto by the potential barriers of the carrier block layers B. Consequently, the cladding layers C are not needed to bear the confinement of carriers, so that the cladding layers C can concentrate on carrier introduction and control of light distribution and heat transfer. Consequently, by setting the Al content of the cladding layer of the AlGaAs type, for example, at a low level, the electric resistance and thermal resistance of the device can be decreased and the light peak intensity can be suppressed.

On the other hand, since the total Al content of the laser device is reduced, the degradation due to oxidation can be suppressed and a mirror surface of desired flatness is easily obtained. Particularly, it is preferable to form the optical waveguide layers of GaAs, and as a result of which, an atom level mirror reflecting crystal orientation can be easily obtained.

In case of using GaAs, by selecting some type of etchant, a high quality inclined mirror facet with a certain angle reflecting the crystal orientation can be formed. On the other hand, for example, when each layer is formed of AlGaAs, since layers containing a large amount of Al show different etching rates, anisotropy corresponding to crystal orientation varies by layer, and accordingly nonuniformity in orientation of the surface after etching is exhibited. As a result, in the case of fabricating a surface-emitting laser by applying wet etching to a laser device comprising AlGaAs multilayer, the inclined facet becomes uneven for each layer and the surface orientation tends to vary by layer. Such a trend is not limited to AlGaAs type materials, and which is possible in three or more components materials.

In addition, the carrier block layer can be as thick as needed to confine carriers therein, and the effect on the light distribution can be minimized. As shown in FIG. 1B, the general form of light intensity distribution is decided mostly only by the waveguide layer G and the cladding layers C, and by making the waveguide layer G thick, the form of light intensity distribution can be changed from the exponential type with a sharp peak to a gentle Gaussian one, and the peak intensity to the total quantity of light can be reduced to great extent, and as a result the degree of facet degradation can be improved remarkably.

Since the carrier block layer contains large amount of Al, the inclined facet can go through a change in inclination or become uneven at the carrier block layer. However, the change in the inclined facet have little effect on light reflection because of the small thickness of the carrier block layer.

BRIEF DESCRIPTION OF THE DRAWINGS

Other and further objects, features, and advantages of the invention will be more explicit from the following detailed description taken with reference to the drawings wherein:

FIGS. 5A and 5B are graphs showing electric resistance and thermal resistance of AlGaAs type materials, respectively.

DETAILED DESCRIPTION OF THE PREFERRED EMBODIMENTS

Figure 1A:
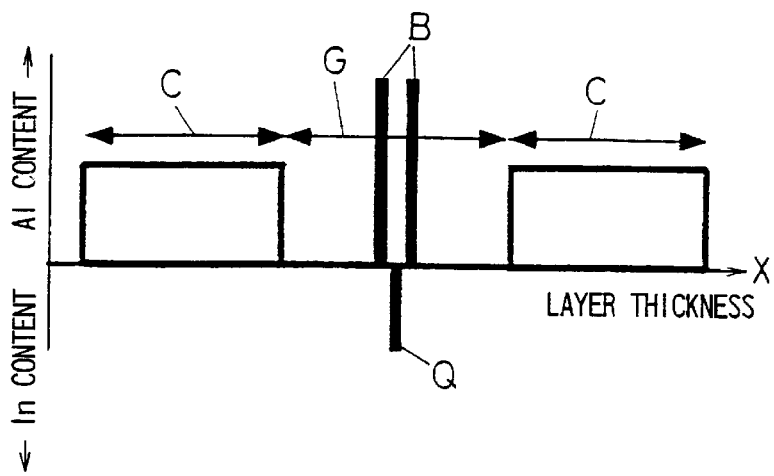
FIG. 1A is a cross-sectional view showing a typical example of a laser device according to the present invention.

Now referring to the drawings, preferred embodiments of the invention are described below.

Figure 2:
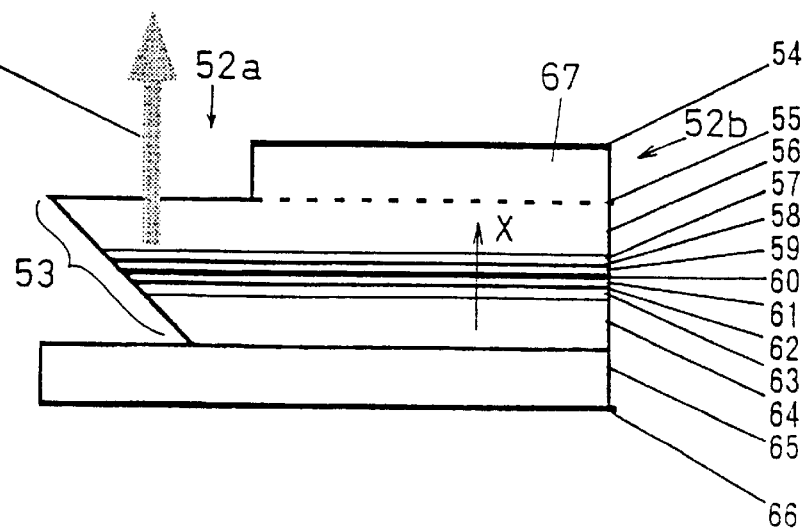
FIG. 2 is a cross-sectional view showing one preferred embodiment of the invention.
Figure 3:
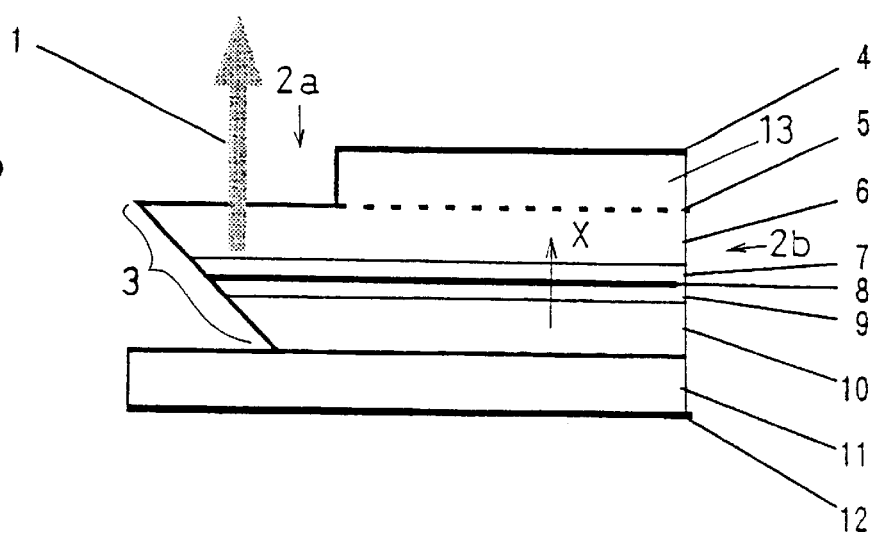
FIG. 3 is a cross-sectional view showing one example of a conventional surface-emitting laser.
Figure 4A:
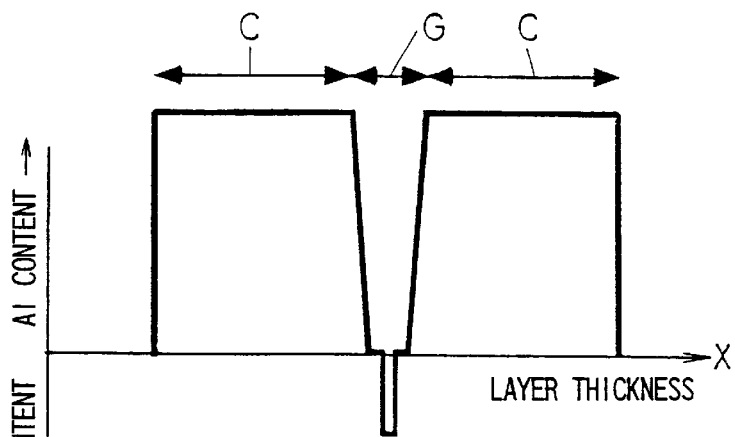
FIG. 4A is a cross-sectional view showing a typical example of a SCH structure.
Figure 4B:
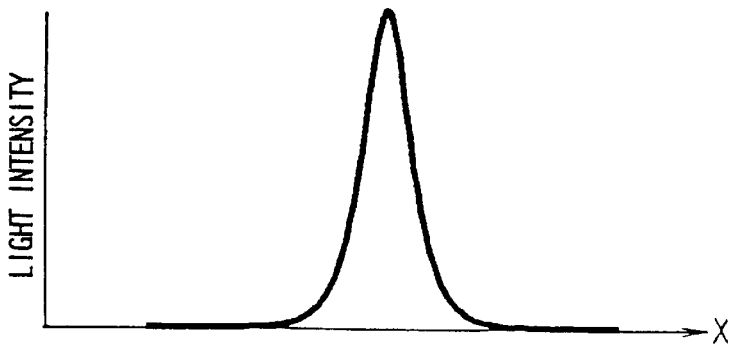
FIG. 4B is a graph showing a light intensity distribution thereof.

FIG. 2 is a cross-sectional view showing an embodiment of the invention. A surface-emitting laser device Is fabricated in such a manner that on a substrate 65 formed of Gas are formed the following layers in sequence by means of MOCVD (metal organic chemical vapor deposition) or the like: a cladding layer 64 (2,000 nm thick) formed of $Al_{0.16}Ga_{0.84}As$, an optical waveguide layer 63 (700 nm thick) formed of GaAs, a carrier block layer 62 (30 nm thick) formed of $Al_{0.30}Ga_{0.70}As$, a side barrier layer 61 (50 nm thick) formed of GaAs, an active layer 60 (8 nm thick) constituted by a quantum well layer formed of InGaAs, a side barrier layer 59 (50 nm thick) formed of GaAs, a carrier block layer 58 (30 nm thick) formed of $Al_{0.30}Ga_{0.70}As$, an optical waveguide layer 57 (700 nm thick) formed of GaAs, a cladding layer 56 (2,000 nm thick) formed of $Al_{0.16}Ga_{0.84}As$, an etching stop layer 55 formed of AlAs, and a contact layer 67 (1,000 nm thick) formed of GaAs. When each layer from the active layer 60 to the substrate 65 is formed as an n-type one, each layer from the active layer 60 to the contact layer 67 is formed as a p-type one, whereas when the former is formed as a p-type, the latter is formed as an n-type one conversely. On the top of the contact layer 67 and on the bottom of the substrate 65, electrodes 54 and 66 for carrier injection are formed, respectively.

In AlGaAs type materials, an energy gap tends to increase with increase in Al content. In this embodiment, band gaps of the optical waveguide layers 57,63 and the side barrier layers 59,61 are wider than that of the active layer 60; a band gap of the cladding layers 56,64 is wider than those of the optical waveguide layers 57,63 and the side barrier layers 59,61; and a band gap of the carrier block layers 58,62 is wider than those of the optical waveguide layers 57,63 and the side barrier layers 59,61.

The active layer 60, the optical waveguide layers 57,63, the side barrier layers 59,61 and the cladding layers 56,64 constitute a waveguide.

The etching stop layer 55 formed between the cladding layer 56 and the contact. layer 67 has a function of preventing the layers below the cladding layer 56 from being etched in a process of forming a horizontal resonator facet 52a by means of wet etching of the contact layer 67. The other resonator facet 52b is formed by cleavage so as to be perpendicular to each layer.

Furthermore, an inclined facet 53 is formed by means of anisotropic etching so as to be on a resonator optical axis between the horizontal resonator facet 52a and the vertical resonator facet 52b. The inclined facet 53 is inclined from the horizontal optical axis by a certain angle, e.g. 45 degrees, and functions as a reflection mirror for bending the optical axis.

As the optical waveguide layers 57,63 and the side barrier layers 59,61 are formed of GaAs, the inclined highly flat facet 53 is easily formed by means of wet etching.

On the resonator facet 52a functioning as an emitting facet of laser beam is formed a reflective film having a reflectance of 10% is formed, and a reflective film having a reflectance of 95% is formed on the other resonator facet 52b. On the inclined facet is formed a reflective film having a reflectance of 95%.

Next, an operation will be explained. When a bias voltage is applied between the electrode 54 and the electrode 66, electrons and holes are injected into the active layer 60 as carriers, and light is radiated by carrier recombination. Then, as the amount of injection current is increased, induced radiation starts and immediately laser oscillation starts between the facet 52a and 52b which constitute an optical resonator. Laser beams exude to the optical waveguide layers 57, 63 formed on both sides of the active layer 60, and the cladding layers 56, 64, and then guided. In this case, since the optical waveguide layers may be thick, the waveguide mode can be spread toward the cladding layers, which bear the carrier confinement. As a result, the peak intensity to the total quantity of light can be reduced to great extent, and the degree of facet degradation can be improved remarkably.

Since the carriers in the active layer 60 are confined in the active layer 60 by the existences of the carrier block layers 58, 62, the recombination efficiency is improved.

With the above constitution, a laser device in which a laser beam having resonated between the resonator facets 52a and 52b is emitted to the external from the resonator facet 52a, functions as a surface-emitting laser device which can output an emitting beam 51 to the external in the normal direction of the substrate 65.

Figure 1B:
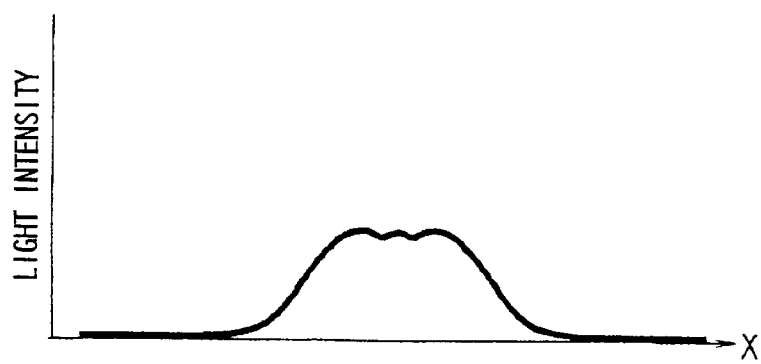
FIG. 1B is a graph showing a light intensity distribution of the laser device of FIG. 1A.

In this embodiment, as the Al contents of the cladding layers 56, 64 can be reduced significantly by forming the carrier block layers 58, 62, total electric resistance and thermal resistance are decreased remarkably. Furthermore, since the carrier block layers 58, 62 are thin enough to hardly influence upon the light distribution, a wider light intensity distribution is obtained, and as shown in FIG. 1B, an occurrence of peak is eliminated, so that the facet degradation is remarkably controlled.

In the above explanation, an example using AlGaAs type semiconductor material was shown, but P (phosphorus)-type and GaN-type semiconductor materials which have a similar relation among band gap, electric resistance and thermal resistance may be used.

Also with regard to the active region, the invention is applicable to laser devices having not only an InGaAs quantum well layer but also a quantum well layer of other material such as InGaAsP, GaN, or to laser devices having a normal double heterostructure whose active region is not a quantum well layer.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A surface-emitting laser device comprising:
   an active layer;
   a pair of optical waveguide layers disposed on both sides of the active layer, having a band gap wider than or equal to that of the active layer;
   a pair of cladding layers disposed so as to sandwich the active layer and the optical waveguide layers, having a band gap of wider than or equal to that of the optical waveguide layers;
   a carrier block layer for confining carriers into the active layer disposed between the active layer and at least one of the optical waveguide layers, having a band gap wider than or equal to those of the active layer and the optical waveguide layer; and
   an inclined facet, formed so as to diagonally cross with an optical axis along the active layer, for reflecting light generated in the active layer to a layer thickness direction, wherein ends of the carrier block layer, pair of waveguide layers and pair of cladding layers constitute a part of the inclined facet whereby thermal resistance can be reduced.

2. The surface-emitting laser device of claim 1, wherein the carrier block layer is disposed between the active layer and each of the optical waveguide layers.

3. The surface-emitting laser device of claim 1, wherein the optical waveguide layers are formed of GaAs.

4. The surface-emitting laser device of claim 1, wherein the active layer is formed of InGaAs.

5. The surface-emitting laser device of claim 1, wherein a thickness of the carrier block layers is in a range of 5 nm to 50 nm.

6. The surface-emitting laser device of claim 1, wherein the cladding layers are formed of $Al_X Ga_{1-X} As$ in which $x \leq 0.3$.

7. A surface-emitting laser device comprising:
   an active layer;
   a pair of optical waveguide layers disposed on both sides of the active layer, having a band gap wider than or equal to that of the active layer;
   a pair of cladding layers disposed so as to sandwich the active layer and the optical waveguide layers, having a band gap of wider than or equal to that of the optical waveguide layers;
   a carrier block layer for confining carriers into the active layer disposed between the active layer and at least one of the optical waveguide layers, having a band gap wider than or equal to those of the active layer and the optical waveguide layer; and
   an inclined facet formed so as to diagonally cross with an optical axis along the active layer, for reflecting light generated in the active layer to a layer thickness direction, wherein ends of the carrier block layer, pair of waveguide layers and pair of cladding layers constitute a part of the inclined facet whereby at least one of thermal saturation and facet degradation at the inclined facet can be suppressed.

8. The surface-emitting laser device of claim 7, wherein the carrier block layer is disposed between the active layer and each of the optical waveguide layers.

9. The surface-emitting laser device of claim 7, wherein the optical waveguide layers are formed of GaAs.

10. The surface-emitting laser device of claim 7, wherein the active layer is formed of InGaAs.

11. The surface-emitting laser device of claim 7, wherein a thickness of the carrier block layers is in a range of 5 nm to 50 nm.

12. The surface-emitting laser device of claim 7, wherein the cladding layers are formed of $Al_X K Ga_{1-X} As$ in which $x \leq 0.3$.

* * * * *